United States Patent

[11] 3,588,525

[72] Inventors Yoshikazu Hatsukano;
Hajime Tsugihashi, Kodaira-shi, Japan
[21] Appl. No. 689,984
[22] Filed Dec. 12, 1967
[45] Patented June 28, 1971
[73] Assignee Hitachi, Ltd.
Chiyoda-Ku, Tokyo, Japan
[32] Priority Dec. 16, 1966
[33] Japan
[31] 41/114207

[54] CHATTERING PREVENTING CIRCUIT
7 Claims, 14 Drawing Figs.

[52] U.S. Cl. .......... 307/202, 307/205, 307/246, 307/251, 307/279, 307/304
[51] Int. Cl. .......... H02h 7/20
[50] Field of Search .......... 307/202, 205, 251, 246, 279, 304, 293, 237; 330/38 (FE)

[56] References Cited

UNITED STATES PATENTS

| | | | |
|---|---|---|---|
| 3,286,189 | 11/1966 | Mitchell et al. | 307/237X |
| 3,267,200 | 8/1966 | Anderson et al. | 307/246X |
| 3,317,754 | 5/1967 | Comer et al. | 307/246X |
| 3,373,295 | 3/1968 | Lambert | 307/304X |
| 3,414,737 | 12/1968 | Bowers | 307/304X |
| 3,388,268 | 6/1968 | Murphree | 307/238 |
| 3,454,789 | 8/1969 | Tyler et al. | 307/304X |

*Primary Examiner*—Donald D. Forrer
*Assistant Examiner*—J. D. Frew
*Attorney*—Craig, Antonelli, Stewart & Hill

ABSTRACT: A chattering preventing circuit wherein an electrical pulse signal containing chattering waveforms generated by turning on and off a predetermined electric circuit by means of a mechanical switch is supplied to the gate electrode of an MOS type field effect transistor through a diode, and a pulse signal containing no chattering waveform is obtained in an output circuit connected with the drain electrode of said transistor by virtue of the charge-discharge phenomenon of the gate input capacitance of said transistor.

INVENTORS
YOSHIKAZU HATSUKANO
HAJIME TSUGIHASHI

BY Craig & Antonelli
ATTORNEYS

INVENTORS
YOSHIKAZU HAZUKANO
HAJIME TSUGIHASHI

BY Craig & Antonelli
ATTORNEYS

CHATTERING PREVENTING CIRCUIT

BACKGROUND OF THE INVENTION

This invention relates to a chattering preventing circuit so designed that an electric pulse signal is generated by the use of a mechanical switch without being affected by the mechanical switch.

In an electronic information-processing apparatus such as electronic computer or the like, it is often the case that it is required that a predetermined command be given by the use of a mechanical switch which is called key-switch or microswitch, for example. In this case, such command is generally an electrical binary signal. In order to read information into an electronic computer, for example, it is a usual practice that a pulse signal with a predetermined amplitude and width is generated by turning on and off a certain electric circuit through actuation of a key-switch. It is well known in the art that chattering waveforms are contained in a pulse signal generated by turning on and off a given electric circuit by means of a mechanical switch as described above.

SUMMARY OF THE INVENTION

It is an object of this invention to provide a novel chattering preventing circuit.

Another object of this invention is to provide a waveform-shaping circuit for generating an electrical pulse signal including no chattering waveform through actuation of a mechanical switch.

Although the strict gist of this invention will be defined in the appended claims, it may briefly be described as follows. That is, the invention of this application resides in a chattering preventing circuit comprising a field effect type switching element, a diode having one terminal thereof connected with the control terminal of said field effect type switching element in such a manner that it serves to cause said switching element to be rendered conductive or nonconductive and it is forward with respect to an input signal generated by the use of a mechanical switch, the other terminal of said diode being connected with a reference potential point through a resistor, wherein said input signal is applied to the connection point between said diode and said resistor. In case where chattering waveforms are included in said input signal, such chattering waveforms are smoothed out by means of a charge-discharge circuit formed by the input capacitance of said switching element, diode and resistor, whereby the switching element is turned on and off by a pulse signal containing substantially no chattering waveforms.

According to one embodiment of this invention, there is provided a circuit arrangement wherein the input signal waveform applied to said switching element can easily be shaped to a desired output waveform.

In accordance with a concrete embodiment of this invention, there is provided a circuit arrangement comprising a mechanical switch having one movable contact and two fixed contacts, a first MOS type field effect transistor having the gate electrode connected with one of the fixed contacts of said mechanical switch, said first MOS type field effect transistor being provided with a predetermined output circuit, and a second MOS type field effect transistor having the gate and source electrodes connected with the gate and source electrodes of said first MOS type field effect transistor, wherein a potential having a predetermined value with respect to the source potential of each of said field effect transistors is applied to said movable contact, and the movable contact is alternately brought into and out of engagement with said fixed contacts so as to produce a rectangular pulse signal in said output circuit by making use of the charge storage effect of said first MOS type field effect transistor and the switching action of said second MOS type field effect transistor. With such circuit arrangement, no chattering waveforms are included in the output signal. The switching action of said MOS type field effect transistor serves to correct deformation in the waveform of the input of said first MOS type field effect transistor due to the storage effect utilized for the aforementioned chattering prevention. In this way, a desired pulse waveform can be obtained in the output circuit.

DESCRIPTION OF THE PREFERRED EMBODIMENTS

Before the preferred embodiments of this invention are described in detail, description will first be made of an example of the conventional circuits of this type for the purpose of giving better understanding of the present invention.

Figures 1A, 1B, 2, 3, 4, 5A, 5B, 5C, 6:
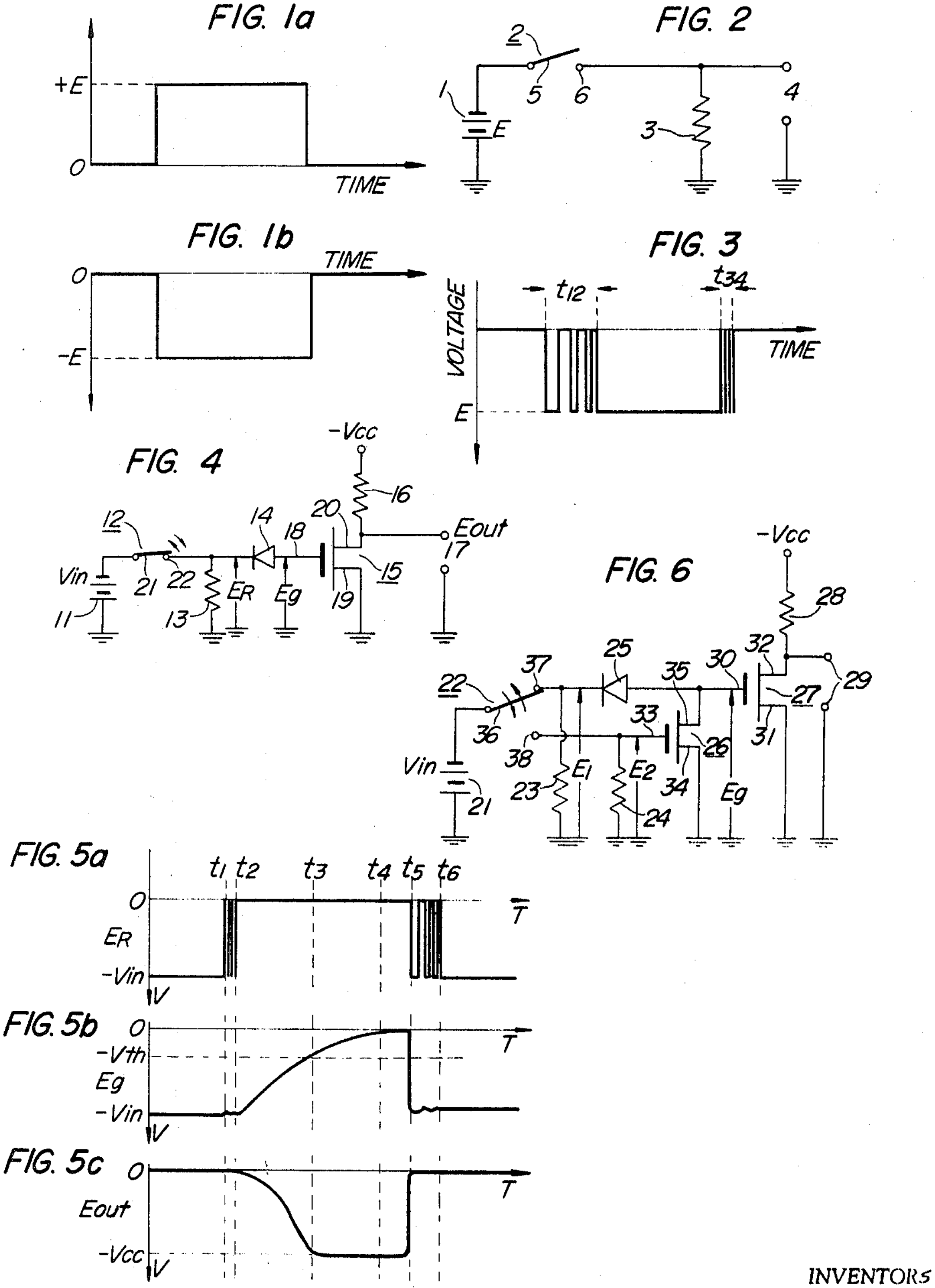
FIGS. 1*a* and 1*b* are views showing pulse waveforms.
FIGS. 2 and 3 are a schematic circuit diagram showing a circuit for generating electrical pulse signals in accordance with the prior art, and a time chart illustrating the output waveform of the circuit of FIG. 2, respectively.
FIG. 4 is a schematic circuit diagram showing the chattering preventing circuit according to an embodiment of this invention.
FIGS. 5*a* to 5*c* are time charts showing the voltage waveforms at certain points in the circuit as shown in FIG. 4.
FIG. 6 is a schematic circuit diagram showing the chattering preventing circuit according to a second embodiment of this invention.

FIGS. 1*a* and 1*b* show the voltage waveforms of the electrical binary signals representing two values such as 0 and +E or 0 and −E which are to be applied as command signals to an information processing apparatus or the like. In accordance with an example of the prior art, such binary signals are generated by such a circuit as shown in FIG. 2, wherein a power source 1 is connected with a contact 5 of a microswitch 2 and a load resistor 3 is connected with another contact 6 of the microswitch so that desired pulse signals are obtained at the output terminals 4 by placing the contact 5 into and out of engagement with the contact 6. With such arrangement, however, there occur chattering waveforms which may be considered to be due to mechanical vibration of the contact 5 of the microswitch 2, when the switch is opened and closed (during periods of time $t_{12}$ and $t_{34}$), as shown in FIG. 3. The periods of time $t_{12}$ and $t_{34}$ during which the voltage level is irregularly changed due to the chattering are several milliseconds, for example. In general, however, comparison of the chattering phenomenon occurring for the period of time $t_{12}$ with that occurring for the period of time $t_{12}$ with that occuring for the period of time $t_{34}$ shows that the former or the chattering occurring for the period of time $t_{12}$ when the switch is closed has a much greater effect than the latter or the chattering occurring for the period of time $t_{34}$ when the switch is opened. If such a signal is applied as an input signal to bistable multivibrator through a differentiation circuit, the multivibrator is often caused to perform errorneous operation due to the chattering waveforms.

In view of the foregoing, the present invention is intended to prevent influence of chattering or similar defects in pulse waveform by the use of a combination of a switching element which is substantially voltage-operated and has a high input impedance such as field effect type switching element with a rectifying element.

Description will now be made of the concrete embodiments of the present invention with reference to the accompanying drawings.

FIG. 4 shows the chattering preventing circuit according to an embodiment of the present invention. This circuit comprises a voltage source 1 with an output voltage $V_{in}$(V), a switch 12 having contacts 21 and 22, a resistor 13, a rectifier diode 14, for example, a semiconductor crystal diode, with a higher breakdown voltage than $V_{in}$, in enhancement mode P-channel MOS type field effect transistor (MOS FET) 15 having a gate electrode 18, a source electrode 19 and a drain electrode 20, a load resistor 16 connected with a power source terminal ($-V_{cc}$), and output terminals 17. The operation of this circuit will be described in connection with FIGS. 5*a* to 5*c*. FIG. 5*a* shows the waveform of a voltage $E_R$ across the resistor 13, FIG. 5*b* shows the waveform of a voltage $E_g$ between the gate 18 and the ground, and FIG. 5*c* shows the waveform of the voltage $E_{out}$ appearing across the output terminals 17.

In FIGS. 4 and 5*a* to 5*c*, the contact 21 which has been maintained engagement with the contact 22 is disposed out of contact with the latter at the point of time $T=t_1$. Thus, a slight chattering waveform will appear for a period of time $t_1-t_2$, as shown in FIG. 5*a*. In this case, it may be considered that a capacitance is equivalently connected between the gate 18 of the MOS FET 15 and the ground. Thus, the equivalent capacitance has been charged through the low resistance of the diode 14 prior to the point of time $T=t_1$, and when the point of time $T=t_1$ is reached, the capacitance will discharge through the backward high resistance of the diode 14 and the resistor 13. The discharging time is so long that the chattering waveform is smoothed out during the time $T=t_1-t_2$, as shown in FIG. 5*b*.

When the contact 21 is completely separated from the contact 22 at $T=t_2$, the charge in the equivalent capacitance starts discharge. This discharge is effected with a sufficiently long time constant, as will be seen from FIG. 5*b*.

When the potential at the gate 18 reaches the threshold voltage ($-V_{th}$) at $T=t_3$, the MOS FET 15 becomes completely nonconductive, and then a voltage substantially equal to $-V_{cc}$ will appear across the output terminals 17, as shown in FIG. 5*c*. When the discharge is completed at $T=t_4$, the gate potential becomes substantially equal to the ground potential.

The contact 21 is again disposed into engagement with the contact 22 at $T=t_5$. As a result, the voltage $E_R$ across the resistor 13 is subjected to chattering waveform during the time $T=t_5-t_6$, as shown in FIG. 5*a*. However, the gate potential will be maintained substantially at a constant value of $-V_{in}$(V) due to the aforementioned charge-discharge phenomenon, as shown in FIG. 5*b*. Consequently, the MOS FET 15 is rendered conductive so that approximately zero voltage will appear across the output terminals, as shown in FIG. 5*c*.

As will be apparent from the foregoing, in accordance with the present invention, an electrical signal affected by the chattering of the mechanical switch as shown in FIG. 5*a* can be converted to one without chattering waveform as shown in FIG. 5*c*. In the foregoing, it has been assumed that the "on" resistance of the MOS FET 15 is substantially zero, and that the "off" resistance thereof is substantially infinite, for the convenience of explanation. The resistor 13 is connected for the purpose of preventing the MOS FET 15 from becoming operationally unstable due to the fact that the input impedance of the MOS FET 15 as looked into from the gate 18 thereof is very high.

As will be appreciated from FIG. 5*c*, the resulting output waveform is preferably shaped into a more accurate rectangular waveform. Such shaping can be achieved by the use of a waveform shaping circuit.

According to a second preferred embodiment of this invention, there is provided a simple and practical circuit capable of preventing chattering and shaping the waveform as shown in FIGS. 5*b* and 5*c*. Description will now be made of a concrete example of such circuit with reference to the drawings.

In FIG. 6, reference numeral 22 represents a single-pole, double-throw changeover switch having a contact 36 and two contacts 37 and 38. The contact 37 of the changeover switch 22 is connected to the ground or reference potential through a resistor 23, and it is connected to the gate 30 of a first field effect transistor (FET) 27 through a semiconductor crystal diode 25. The drain 32 of the FET 27 is connected with a voltage source $-V_{cc}$ through a load resistor 28, and an output terminal 29 is connected with one end of the load resistor 28. Between the gate 30 and the source 31 of the FET 27 is connected to the source-drain path of a second field effect transistor 26 of which the gate 33 is connected with the other contact 38 of the switch 22. Between the gate 33 and source 34 of the FET 26 is also connected a resistor 24 is preventing the charge storage effect therebetween. A unidirectional voltage source 21 is connected with the contact 36 of the switch 22.

For the convenience of explanation, the operation of the above circuit arrangement will now be described for the case where the field effect transistors 26 and 27 are P-channel enhancement mode field effect transistors which are nonconductive in the absence of an input gate signal, as is the case with the aforementioned embodiment. Due to the fact that the FET's 26 and 27 are P-channel ones, the polarities of the voltage source 21 are determined in the directions as shown in FIG. 6.

The operation of the circuit as shown in FIG. 6 will now be described with reference to FIGS. 7*a* to 7*d*. The initial condition is assumed to be such that the contact 36 is in engagement with the contact 37, that a signal is supplied to the FET 27 so that the latter is rendered conductive, and that no signal is supplied to the FET 26 so that the latter is rendered nonconductive. Namely, in the initial condition, the equivalent capacitance between the gate 30 and the source 31 of the FET 27 has been charged substantially at $-V_{in}$. FIGS. 7*a*, 7*b*, 7*c* and 7*d* show the voltage $E_1$ across the resistor 23, voltage $E_2$ across the resistor 24, input voltage $E_g$ to the gate 30 and output voltage $E_{out}$ across the output terminals 29, respectively.

Figures 7A, 7B, 7C, 7D:
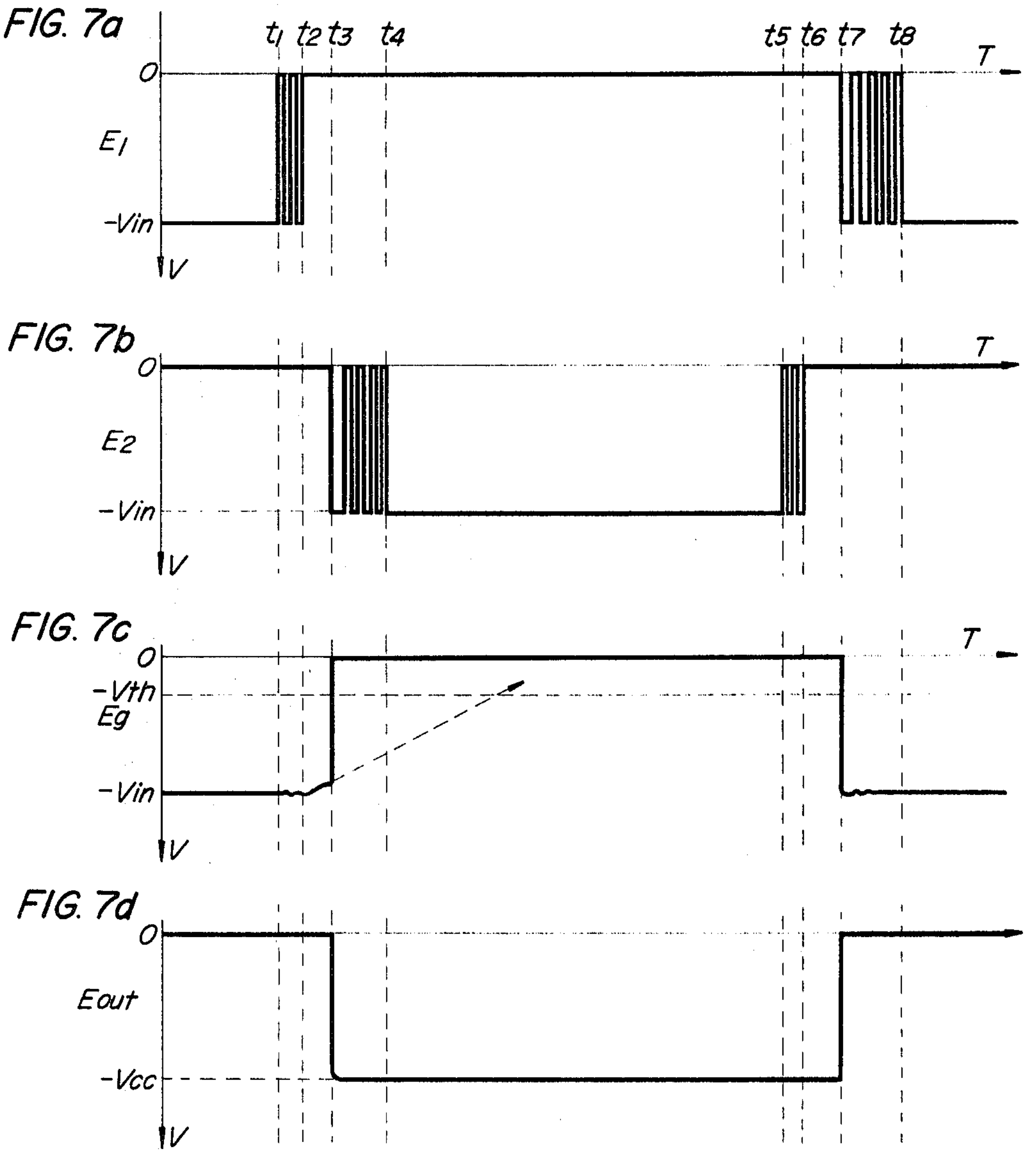
FIGS. 7*a* to 7*d* are time charts showing the voltage waveforms at certain points in the circuit as shown in FIG. 6.

When the contact 36 is separated from the contact 37 at $T=t_1$, a chattering waveform appears in part of the voltage $E_1$ due to the mechanical vibration of the contact 36 for the period of time from $t_1$ to $t_2$, as shown in FIG. 7*a*. During the time $T=t_1-t_2$, no signal is supplied to the FET 26 so that the latter is in the "off" state. Since the diode 25 is reversely biased by the discharge voltage of the equivalent capacitance between the gate 30 and the source 31, the equivalent resistance inserted between the gate and the source of the FET 27 becomes high when the contact 36 is separated from the contact 37. Due to a charge-discharge phenomenon similar to that in the aforementioned embodiment, the chattering waveform is smoothed out as shown in FIG. 7*c*, so that the gate voltage $E_g$ is converted to one having no chattering waveform at $T=t_1$ to $t_2$.

During the time $T=t_2-t_3$, that is, when the contact 36 is not disposed in engagement with either of the contacts 37 and 38, the charge stored in the equivalent capacitance between the gate 30 and the source 31 of the FET 27 starts to be discharged with a long discharge time constant determined by said equivalent capacitance and said equivalent resistance. Such condition is shown by the dotted line in FIG. 7*c*. The gate voltage $E_g$ is gradually decreased, while at a point of time $T=t_3$ which is reached far before the gate voltage $E_g$ reaches the threshold voltage $-V_{th}$ of the FET 27, a signal is applied to the FET 26 to render the latter conductive so that the discharge is rapidly effected with the result that the voltage $E_g$ is suddenly decreased down to zero. The aforementioned time constant is considerably long as compared with the cyclic period of the chattering waveform, since the equivalent capacitance is 0.1 to 0.5 pf., the resistance 23 is 1 kΩ to 10 MΩ, and the backward resistance of the PN junction in the diode 25 is 100 to 1,000 MΩ. Said capacitance may be increased by connecting a separate capacitor, if necessary. The values of the resistors 23 and 24 may also be optionally selected in such a range that the FETs 26 and 27 do not become unstable in operation.

Then at $T=t_3$, the contact 36 is connected to the contact 38.

During the time $T=t_5-t_6$, that is, when the contact 36 is mechanically made in or out of engagement with the contact 38, a chattering waveform occurs in the gate voltage $E_2$ of the FET 26. The chattering waveform in $E_2$ becomes as shown in FIG. 7*c*, since the resistance 24 is relatively low, for example, 100 Ω to 10 kΩ. It is to be noted, however, that this FIG. is somewhat exaggerated. By increasing the resistance 24 to such an extent that the operation of the FET 26 does not become unstable, or by connecting a diode with the gate 33 of the FET 26 in the same manner that the diode is connected with the gate of the FET 27, it is possible to smooth out the chattering waveform of the gate voltage $E_2$. In this case, however, it is not necessarily required that the voltage $E_2$ be smoothed out, since the FET 26 is rendered conductive and the FET 27 is rendered nonconductive by the first pulse of the voltage $E_2$ so that it is not affected by the switching condition of the FET 26. Therefore, at $T=t_3$, the output voltage $E_{out}$ across the output terminals 29 becomes abruptly a voltage of $-V_{cc}$ as shown in FIG. 7*d*.

At $T=t_6$, that is, when the contact 36 is opened from the contact 38 toward the contact 37, chattering occurs during the time $T=t_5-t_6$. In this case, however, the gate voltage $E_g$ of the FET 27 is maintained substantially at zero irrespective of the chattering. Consequently, the FET 27 is kept in the "off" state so that a voltage substantially equal to $(-V_{cc})$ is obtained which is not affected by the chattering at $T=t_5-at_6$.

At $T=t_7$, the contact 36 is brought into engagement with the contact 37, and thus chattering occurs during the time $T=t_7-t_8$. In this case, however, the gate voltage $E_g$ of the FET 27 is maintained substantially at a constant value such as $-V_{in}$ with respect to the source, as shown in FIG. 7*c*. The reason is that the source-drain path of the transistor 26 is made nonconductive so that the waveform-shaping operation is preformed by such charge-discharge phenomenon as observed in the foregoing embodiment since no signal is supplied to the gate 33 of the FET 26 during the time $T=t_7-t_8$. Thus, the transistor 27 is rendered conductive irrespective of the chattering so that output $E_{out}$ becomes instantly equal to the ground potential, i.e. zero potential, as shown in FIG. 7*d*.

As described above, the regularly changing gate voltage $E_g$, as shown in FIG. 7*c*, can be obtained at the gate of the transistor 27 without being adversely affected by the chattering, with a result that a pulse voltage which is not affected by the chattering appears across the output terminals 29 connected with the transistor 27, as shown in FIG. 7*d*.

From the following description, it will be readily appreciated that the transistor 26 is not substantially related to the chattering prevention but it merely contributes to produce a desired rectangular pulse is shaped form by causing a voltage resulting from the stored charge to be discharged in a suitable time.

The conductivity type of the channel to the field effect transistor is determined in accordance with the polarity of the required voltage level with respect to the reference potential point. In the foregoing embodiment, use has been made of a P-type channel field effect transistor as the transistor 27 to produce a negative-going pulse wave as an output voltage $E_{out}$. In case it is desired to produce a positive-going pulse signal, however, use is made of an N-type channel field effect transistor. The transistor 27 may also be a junction-type field effect transistor. In either case, it is necessary to use a voltage-operated switching element or circuit with a high input impedance.

Although, in the foregoing, description has been made of the case where the transistor 26 is made of a MOS FET, use may equally be made of other type of switching element such as, for example, the conventional semiconductor switching element which is driven by the signal DC power source 21.

Figure 8:
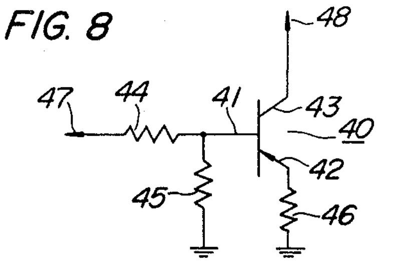
FIG. 8 is a view useful for explaining a modification to the circuit as shown in FIG. 6.

FIG. 8 shows a circuit arrangement using a PNP bipolar transistor as the transistor 26. The PNP transistor 40 comprising a base 41, emitter 42 and collector 43 has biasing resistors 44, 45, and 46 connected therewith. An input terminal 47 is connected with the contact 38 of FIG. 6, and an output terminal 48 is connected with the gate of the FET 27. Thus, the circuit of FIG. 6 can be normally operated by the use of the transistor 40 as in the case where the FET 26 is used. In this way, such an output signal as shown in FIG. 7*d* is available across the output terminals 29 of FIG. 6.

Although, in the foregoing, the present invention has been described with respect to several specific embodiments thereof, it will be readily apparent to those skilled in the art that various modifications become possible within the scope of the appended claims. For example, it goes without saying that a signal produced by turning on and off a predetermined electric circuit by means of a mechanical switch may be supplied to the chattering preventing circuit according to the present invention through an amplifier the like, instead of being supplied directly to such chattering preventing circuit.

We claim:

1. A circuit arrangement for generating an electrical pulse signal by the use of a mechanical switch, comprising:

a. a first DC power source having first and second terminals with opposite polarities to each other, said first terminal being connected to a reference potential point;

b. a mechanical switching means having first and second contacts and a third contact connected with the second terminal of said power source for supplying the potential of said second terminal of said power source alternately to said first and said second contacts;

c. an electronic switching means having at least first and second output electrodes and a control electrode, said first output electrode being connected with the reference potential point, said control electrode being connected with said second contact of said mechanical switching means;

d. a field effect transistor having a pair of first and second output electrodes and a gate electrode, said first output electrode of said transistor being coupled to the reference potential point, said gate electrode being connected with the second output electrode of said switching means;

e. a rectifying diode connected between said first contact of said mechanical switching means and the gate electrode of said field effect transistor in such a polarity that it is forwardly biased by said first power source;

f. a first resistance means connected between said first contact of said mechanical switching means and said reference potential point;

g. a second resistance means connected between said second contact of said mechanical switching means and the reference potential point;

h. a load resistance means having a pair of terminals; one of the terminals of said load resistance means being connected with said second output electrode of said transistor;

i. a second DC power source connected between the reference potential point and the other of the terminals of said load resistance means; and j. an output terminal connected with the second output electrode of said transistor for obtaining an output signal between itself and the reference potential point.

2. A circuit arrangement as set forth in claim 1, wherein said electronic switching means means is composed of a field effect transistor.

3. A circuit arrangement as set forth in claim 1, wherein said electronic switching means is composed of a bipolar transistor.

4. An electronic circuit comprising:

A field effect transistor having a first and a second second output electrode and a gate electrode, the first output electrode being connected to a common reference potential;

an electronic switching means having a first and a second output electrode, and a control electrode, the first and the second output electrodes of the switching means being connected to the common reference potential and said gate electrode, respectively;

A constant voltage source means having a first and a second terminal, the first terminal of the source means being connected to the common reference potential;

a rectifying element having a first and a second terminal, the first terminal of the rectifying element being connected to the gate electrode so that the rectifying element is forwardly biased by the constant voltage source means; and a mechanical switching means for supply the electric potential of the second terminal of the source means alternatively to the second terminal of the rectifying element and the control electrode of the electronic switching means, whereby when the potential of the second terminal of the source means is applied to the second terminal of the rectifying element an electric charge due to the electric potential of the source means is stored in the input capacitance of the gate electrode of the field effect transistor through the rectifying element, while when the electric potential of the source means is applied to the control electrode of the electric switching means the electronic switching means is turned on by the potential of the source means and the charge stored in the input capacitance of the gate electrode is discharged through the electronic switching means.

5. An electronic circuit comprising:

a field effect transistor having a first and a second output electrode, and a gate electrode, the first output electrode being connected to a common reference potential;

a first switching means having a first and a second output electrode, and a control electrode, the first and the second output electrode of the first switching means being connected to the common reference potential and said gate electrode, respectively;

a rectifying element having first and a second terminal, the first terminal of the rectifying element being connected to the gate electrode; and a second switching means for supplying a first electric potential sufficient to make the field effect transistor conductive intermittently to the second terminal of the rectifying element and for supplying a second electric potential sufficient to make the first switching means conductive intermittently to the control electrode of the first switching means in synchronism with the said first electric potential so that the second electric potential is applied to the control electrode of the first switching means when the first electric potential is not applied to the second terminal of the rectifying element, whereby when the first electric potential is applied to the second terminal of the rectifying element an electric charge due to the first electric potential is stored in the input capacitance of the gate electrode of the field effect transistor through the rectifying element, while when the second electric potential is applied to the control electrode of the first switching means the first switching means is turned on by the second electric potential and the electric charge stored in the input capacitance of the gate electrode is discharged through the first electronic switching means.

6. The electronic circuit according to claim 4, wherein said field effect transistor and said electronic switching means are insulated gate field effect transistors of P-type channel, said rectifying element is a PN junction diode the anode of which is connected to the gate of the field effect transistor, the potential of the second terminal of the source means is negative with respect to the common reference potential.

7. The electronic circuit according to claim 5, wherein said field effect transistor and the said first switching means are insulated gate field effect transistors of P-type channel, said rectifying element is a PN junction diode the anode of which is connected to the gate of the field effect transistor, the first and the second electric potential are negative with respect to the common reference potential.